(12) United States Patent
Zuo

(10) Patent No.: US 12,165,883 B2
(45) Date of Patent: Dec. 10, 2024

(54) SEMICONDUCTOR DEVICE AND OXYGEN REMOVAL METHOD THEREOF

(71) Applicant: CHANGXIN MEMORY TECHNOLOGIES, INC., Hefei (CN)

(72) Inventor: Min Zuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 597 days.

(21) Appl. No.: 17/438,850

(22) PCT Filed: May 26, 2021

(86) PCT No.: PCT/CN2021/095915
§ 371 (c)(1),
(2) Date: Sep. 13, 2021

(87) PCT Pub. No.: WO2022/001507
PCT Pub. Date: Jan. 6, 2022

(65) Prior Publication Data
US 2022/0384215 A1 Dec. 1, 2022

(30) Foreign Application Priority Data
Jun. 29, 2020 (CN) .......................... 202010603283.4

(51) Int. Cl.
*F16K 11/087* (2006.01)
*H01L 21/67* (2006.01)
*C23C 16/44* (2006.01)

(52) U.S. Cl.
CPC .... *H01L 21/67017* (2013.01); *F16K 11/0873* (2013.01); *H01L 21/67253* (2013.01); *C23C 16/4412* (2013.01); *H01L 21/67098* (2013.01)

(58) Field of Classification Search
CPC ......... H01L 21/67017; H01L 21/67253; H01L 21/67098; H01L 21/67109; F16K 11/0873; C23C 16/4412; C23C 16/44
See application file for complete search history.

(56) References Cited

U.S. PATENT DOCUMENTS 3,166,098 A * 1/1965 Jennings ............. F16K 11/0873
251/367
6,159,298 A * 12/2000 Saito ................... C23C 16/4412
118/715
(Continued)

FOREIGN PATENT DOCUMENTS

CN 1269191 C 8/2006
CN 203926909 U * 11/2014
(Continued)

OTHER PUBLICATIONS

International Search Report cited in PCT/CN2021/095915 mailed Aug. 27, 2021, 10 pages.

*Primary Examiner* — Dung H Bui
(74) *Attorney, Agent, or Firm* — Syncoda LLC; Feng Ma

(57) ABSTRACT

The present invention discloses a semiconductor device and an oxygen removal method thereof. The semiconductor device comprises: a process cavity, an oxygen removal pipe and an oxygen detection device, wherein the oxygen detection device comprises an oxygen detection pipe, a switching ball valve and an oxygen sensor; the oxygen detection pipe comprises a first pipe, a second pipe and a third pipe which are arranged in parallel and all connected to the oxygen removal pipe and the switching ball valve; the oxygen sensor is arranged on the third pipe; and, the switching ball valve is constructed in such a way that the switching ball valve communicates the first pipe with the second pipe in an
(Continued)

oxygen removal stage and communicates the first pipe with the third pipe in an oxygen detection stage.

18 Claims, 3 Drawing Sheets

(56) References Cited

U.S. PATENT DOCUMENTS

| | | | |
|---|---|---|---|
| 6,165,272 A * | 12/2000 | Liu | C23C 16/4412 |
| | | | 137/554 |
| 2005/0145333 A1 | 7/2005 | Kannan et al. | |
| 2014/0287596 A1 * | 9/2014 | Hirose | H01L 21/0228 |
| | | | 438/786 |
| 2015/0031216 A1 * | 1/2015 | Akae | C23C 16/345 |
| | | | 118/704 |
| 2016/0341620 A1 | 11/2016 | Perkins et al. | |
| 2017/0183770 A1 | 6/2017 | Komae et al. | |
| 2018/0364084 A1 * | 12/2018 | Cheng | C23C 16/4412 |
| 2019/0093218 A1 * | 3/2019 | Lay | C23C 16/4405 |
| 2020/0385867 A1 * | 12/2020 | Kim | C23C 16/52 |
| 2022/0025977 A1 * | 1/2022 | Wang | F16K 11/076 |

FOREIGN PATENT DOCUMENTS

| | | |
|---|---|---|
| CN | 107078052 A | 8/2017 |
| CN | 109097755 A | 12/2018 |
| CN | 209174524 U | 7/2019 |
| CN | 110289231 A | 9/2019 |
| KR | 20010058811 A | 7/2001 |
| WO | 2020096360 A1 | 5/2020 |

* cited by examiner

SEMICONDUCTOR DEVICE AND OXYGEN REMOVAL METHOD THEREOF

CROSS-REFERENCE TO RELATED APPLICATIONS

The present application claims the priority to the Chinese Patent Application 202010603283.4, titled "SEMICONDUCTOR DEVICE AND OXYGEN REMOVAL METHOD THEREOF", filed on Jun. 29, 2020, which is incorporated herein by reference in its entirety.

TECHNICAL FIELD

The present invention relates to the technical field of semiconductor devices, in particular to a semiconductor device and an oxygen removal method thereof.

BACKGROUND

During the high-temperature thermal treatment of wafers, the oxygen concentration in the process cavity is highly required. If the oxygen concentration in the chamber does not reach the standard, oxides will be formed on the surfaces of the wafers, resulting in poor performance of products. In order to satisfy the requirements for oxygen concentration in the manufacturing process, a large amount of nitrogen is generally fed before the high-temperature manufacturing process to remove oxygen in the process cavity. The oxygen removal systems in the related art have inaccurate detection results so that the machine is easy to give an alarm. Moreover, the oxygen sensors of the oxidization detection devices are easily damaged and aged.

SUMMARY

As described in the background, the oxygen removal systems in the related art have inaccurate oxygen detection results so that the machine is easy to give an alarm, and the oxygen sensors are easily damaged and aged.

It was found that, for the oxygen removal systems in the related art, a part of the mixed gas with a high oxygen concentration will enter the branch pipe of the oxygen detection device in the initial stage of oxygen removal, and this part of the mixed gas is difficult to remove in the final stage of oxygen removal.

After the oxygen detection function is activated, the mixed gas with a high oxygen concentration enters the oxygen sensor, and negatively charged oxygen ions are adsorbed onto inner and outer surfaces of zirconium oxide under the catalysis of platinum. Since there is more oxygen in the atmosphere than in the machine pipe, more negative ions are adsorbed on the side where the atmosphere is communicated than the side where the machine pipe is located, so that an electromotive force is produced by the difference in concentration between ions on two sides. An electrical signal is processed by a computer to reflect the oxygen concentration in the process cavity. When the oxygen concentration reaches the minimum concentration required by the process within a specified time, the process automatically proceeds to a next step. If the oxygen concentration does not reach the minimum concentration, the machine triggers an alarm. Therefore, a high oxygen concentration easily causes the machine to give an alarm after a high concentration of oxygen in the branch pipe of the oxygen detection device enters the oxygen sensor, and long-term contact with a high concentration of oxygen will quicken the aging of the oxygen sensor.

The semiconductor device according to embodiments of the present invention comprises: a process cavity, having an oxygen removal inlet and an oxygen removal outlet; an oxygen removal pipe, connected to the oxygen removal outlet and an exhaust device, respectively; and, an oxygen detection device, comprising an oxygen detection pipe, a switching ball valve and an oxygen sensor, the oxygen detection pipe comprising a first pipe, a second pipe and a third pipe which are arranged in parallel and all connected to the oxygen removal pipe and the switching ball valve, the first pipe, the second pipe and the third pipe being successively communicated with the oxygen removal pipe in a gas flow direction of the oxygen removal pipe, the oxygen sensor being arranged on the third pipe, the switching ball valve being constructed in such a way that the switching ball valve communicates the first pipe with the second pipe in an oxygen removal stage and communicates the first pipe with the third pipe in an oxygen detection stage.

For the semiconductor device according to the embodiments of the present invention, by providing the second pipe and the switching ball valve connected to the first pipe, the second pipe and the third pipe, and by controlling the switching ball valve to communicate different pipes in the oxygen removal stage and the oxygen detection stage, a gas with a high oxygen concentration residual in the oxygen detection pipe in the oxygen removal stage can be discharged, the gas with a high oxygen concentration residual in the oxygen detection stage can be prevented from flowing to the oxygen sensor and causing an alarm due to inaccurate oxygen concentration detection, and the gas with a high oxygen concentration can also be prevented from flowing through the oxygen sensor and quickening the aging of the oxygen sensor.

The present invention further provides an oxygen removal method for a semiconductor device.

In the oxygen removal method for a semiconductor device according to the embodiments of the present invention, the semiconductor device comprises a process cavity, an oxygen removal pipe and an oxygen detection device; the oxygen detection device comprises an oxygen detection pipe, a switching ball valve and an oxygen sensor; the oxygen detection pipe comprises a first pipe, a second pipe and a third pipe which are arranged in parallel and all connected to the oxygen removal pipe and the switching ball valve respectively; the first pipe, the second pipe and the third pipe are successively communicated with the oxygen removal pipe in a gas flow direction of the oxygen removal pipe; the oxygen sensor is arranged on the third pipe; and, the oxygen removal method comprises: feeding an oxygen removal gas into the process cavity of the semiconductor device; after the oxygen removal gas is fed into the process cavity for a first preset time, adjusting the switching ball valve to communicate the first pipe with the second pipe, not turning on the oxygen sensor, and continuously feeding the oxygen removal gas into the process cavity; and, after the oxygen removal gas is continuously fed into the process cavity for a second preset time, adjusting the switching ball valve to communicate the first pipe with the third pipe, and turning on the oxygen sensor.

in which:

100: semiconductor device;

1: process cavity; 11: process chamber; 12: oxygen removal inlet; 13: oxygen removal outlet;

2: oxygen removal pipe;

3: oxygen detection device; 31: oxygen detection pipe; 311: first pipe; 312: second pipe; 313: third pipe; 314: fourth pipe; 315: valve port connected to the first pipe; 316: valve port connected to the second pipe; 317: valve port connected to the third pipe; 318: valve port connected to the fourth pipe; 32: switching ball valve; 321: switching switch body; 322: valve chamber; 323: switching valve core; 324: first passage; 325: second passage; 326: third passage; 33: first control valve; 34: second control valve; 35: fourth control valve; 36: oxygen sensor; and

4: exhaust device.

DETAILED DESCRIPTION

The specific implementations of the semiconductor device and the oxygen removal method thereof according to the present invention will be described in detail below with reference to the accompanying drawings.

The present invention is obtained by the inventor(s) based on the following recognitions and findings.

As described in the background, the oxygen removal systems in the prior art have inaccurate oxygen detection results to cause the machine to easily give an alarm, and the oxygen sensors are easily damaged and aged.

It was found that, for the oxygen removal systems in the prior art, a part of the mixed gas with a high oxygen concentration will enter the branch pipe of the oxygen detection device in the initial stage of oxygen removal, and this part of the mixed gas is difficult to remove in the final stage of oxygen removal. After the oxygen detection function is activated, the mixed gas with a high oxygen concentration enters the oxygen sensor, and negatively charged oxygen ions are adsorbed onto inner and outer surfaces of zirconium oxide under the catalysis of platinum. Since there is more oxygen in the atmosphere than in the machine pipe, more negative ions are adsorbed on the side where the atmosphere is communicated than the side where the machine pipe is located, so that an electromotive force is produced by the difference in concentration between ions on two sides. An electrical signal is processed by a computer to reflect the oxygen concentration in the process cavity. When the oxygen concentration reaches the minimum concentration required by the process within a specified time, the process automatically proceeds to a next step. If the oxygen concentration does not reach the minimum concentration, the machine triggers an alarm. Therefore, a high oxygen concentration easily causes the machine to give an alarm after a high concentration of oxygen in the branch pipe of the oxygen detection device enters the oxygen sensor, and long-term contact with a high concentration of oxygen will quicken the aging of the oxygen sensor.

The semiconductor device 100 according to an embodiment of the present invention will be described below with reference to the accompanying drawings.

Figure 1:
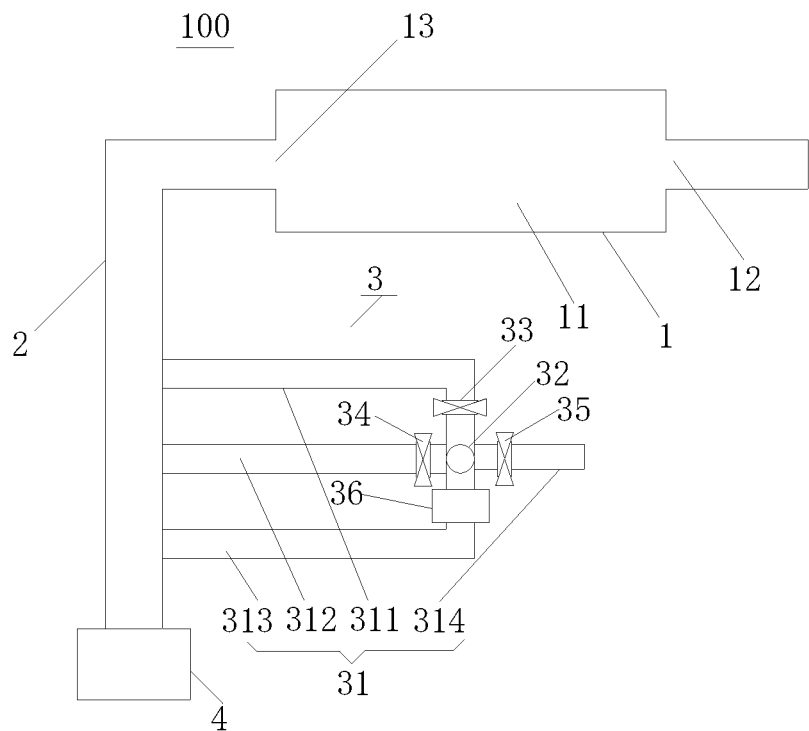
FIG. 1 is a schematic structure diagram of a semiconductor device according to an embodiment of the present invention.

As shown in FIG. 1, the semiconductor device 100 according to an embodiment of the present invention may comprise a process cavity 1, an oxygen removal pipe 2 and an oxygen detection device 3.

The process cavity 1 has an oxygen removal inlet 12 and an oxygen removal outlet 13. As shown in FIG. 1, a process chamber 11 is defined in the process cavity 1, and both the oxygen removal inlet 12 and the oxygen removal outlet 13 are communicated with the process chamber 11. Specifically, the process cavity 1 is a reaction chamber for high-temperature thermal treatment of a semiconductor. The high-temperature thermal treatment is carried out in the process chamber 11 and has very high requirements for the oxygen concentration in the process chamber 11. In order to satisfy the requirements of the manufacturing process for the oxygen concentration, a large amount of an oxygen removal gas (e.g., nitrogen) is fed before high-temperature manufacturing to remove oxygen in the process chamber 11, so that the oxygen concentration satisfies the standard. The oxygen removal inlet 12 may be communicated with an oxygen removal gas supply device. The oxygen removal gas is fed from the oxygen removal inlet 12, and the mixed gas of oxygen and the oxygen removal gas is discharged from the oxygen removal outlet 13.

The oxygen removal pipe 2 is connected to the oxygen removal outlet 13 and an exhaust device 4, respectively. In this way, the mixed gas of oxygen and the oxygen removal gas flows to the oxygen removal pipe 2 from the oxygen removal outlet 13, then flows to the exhaust device 4, and is discharged by the exhaust device 4.

The oxygen detection device 3 is configured to detect the oxygen concentration. For example, after oxygen removal is performed for a period of time, the oxygen detection device 3 starts to operate, the gas in the process chamber 11 flows to the oxygen detection device 3 through the oxygen removal pipe 2, and the oxygen detection device 3 detects the oxygen concentration of the gas to determine whether the oxygen concentration in the process chamber 11 satisfies the requirements.

The oxygen detection device 3 may comprise an oxygen detection pipe 31, a switching ball valve 32 and an oxygen sensor 36. The oxygen detection pipe 31 comprises a first pipe 311, a second pipe 312 and a third pipe 313, which are arranged in parallel and all connected to the oxygen removal pipe 2 and the switching ball valve 32. That is, the first pipe 311, the second pipe 312 and the third pipe 313 are arranged independently from each other. Two ends of the first pipe 311 are connected to the oxygen removal pipe 2 and the switching ball valve 32, respectively; two ends of the second pipe 312 are connected to the oxygen removal pipe 2 and the switching ball valve 32, respectively; and, two ends of the third pipe 313 are connected to the oxygen removal pipe 2 and the switching ball valve 32, respectively. The oxygen sensor 36 is arranged on the third pipe 313 to detect the oxygen concentration in the process chamber 11. The switching ball valve 32 is connected to the first pipe 311, the second pipe 312 and the third pipe 313, respectively, to control the on or off of the first pipe 311, the second pipe 312 and the third pipe 313.

In a gas flow direction of the oxygen removal pipe 2, the first pipe 311, the second pipe 312 and the third pipe 313 are successively communicated with the oxygen removal pipe 2. That is, in an oxygen removal stage, in the gas flow direction of the oxygen removal pipe 2, the connection port between the oxygen removal pipe 2 and the first pipe 311 is located upstream of the connection port between the oxygen removal pipe 2 and the second pipe 312, and the connection port between the oxygen removal pipe 2 and the second pipe 312 is located upstream of the connection port between the oxygen removal pipe 2 and the third pipe 313. The gas in the oxygen removal pipe 2 successively flows through the port between the oxygen removal pipe 2 and the first pipe 311, the port between the oxygen removal pipe 2 and the second pipe 312 and the port between the oxygen removal pipe 2 and the second pipe 312.

The switching ball valve 32 is constructed in such a way: in an oxygen removal stage, the switching ball valve 32 communicates the first pipe 311 with the second pipe 312 and blocks the third pipe 313, so that the third pipe 313 is not communicated with the first pipe 311 and the second pipe 312, the mixed gas in the first pipe 311 does not flow to the third pipe 313, and the mixed gas with a high oxygen concentration flowing from the oxygen removal pipe 2 to the first pipe 311 flows to the second pipe 312 through the switching ball valve 32; and, in an oxygen detection stage, the switching ball valve 32 communicates the first pipe 311 with the third pipe 313, so that the second pipe 312 is not communicated with the first pipe 311 and the third pipe 313, and the gas flowing from the oxygen removal pipe 2 to the first pipe 311 flows to the third pipe 313 through the switching ball valve 32.

Specifically, in the oxygen removal stage, the mixed gas in the process cavity 1 is discharged through the oxygen removal pipe 2. Since the first pipe 311 is communicated with the oxygen removal pipe 2, the mixed gas inevitably flows into the first pipe 311. The first pipe 311 is communicated with the second pipe 312 through the switching ball valve 32, so the mixed gas entering the first pipe 311 may flow to the second pipe 312 through the switching ball valve 32 and then flow to the oxygen removal pipe 2 for discharging. Thus, the mixed gas with a high oxygen concentration in the first pipe 311 can be discharged and the mixed gas with a high oxygen concentration in the first pipe 311 in the oxygen detection stage can be prevented from flowing to the oxygen sensor 36 on the third pipe 313. Accordingly, the mixed gas with a high oxygen concentration residual in the oxygen detection pipe 31 can be prevented from flowing to the oxygen sensor 36 and causing the machine to give an alarm, and the mixed gas with a high oxygen concentration can also prevented from contacting with the oxygen sensor 26 and resulting in the aging of the oxygen sensor 26, so that the service life of the oxygen sensor 26 is improved.

In the oxygen detection stage, the oxygen concentration of the gas in the process chamber 11 is reduced after the oxygen removal gas is fed for a period of time, and the first pipe 311 is communicated with the third pipe 313 through the switching ball valve 32. In this way, the gas in the process chamber 11 flows to the oxygen removal pipe 2, and then flows to the oxygen sensor 36 on the third pipe 313 through the first pipe 311, so that the oxygen sensor 36 can accurately detect the oxygen concentration of the gas in the process chamber 11. The third pipe 313 is communicated with the oxygen removal pipe 2, so that the gas can flow to the oxygen removal pipe 2 for discharging. Thus, the oxygen concentration in the process chamber 11 can be accurately detected, and the machine can be prevented from giving an alarm due to a too high oxygen concentration.

Therefore, for the semiconductor device 100 according to the embodiment of the present invention, by providing the second pipe 312 and the switching ball valve 32 connected to the first pipe 311, the second pipe 312 and the third pipe 313, and by controlling the switching ball valve 32 to communicate different pipes in the oxygen removal stage and the oxygen detection stage, the gas with a high oxygen concentration residual in the oxygen detection pipe 31 in the oxygen removal stage can be discharged, the gas with a high oxygen concentration residual in the oxygen detection stage can be prevented from flowing to the oxygen sensor 36 and causing an alarm due to inaccurate oxygen concentration detection, and the gas with a high oxygen concentration can also be prevented from flowing through the oxygen sensor 36 and quickening the aging of the oxygen sensor 36.

In some embodiments of the present invention, the oxygen detection pipe 31 further comprises a fourth pipe 314 which is connected to the switching ball valve 32 and an oxygen removal gas supply device, respectively; and, the switching ball valve 32 is constructed in such a way that the switching ball valve 32 communicates the third pipe 313 with the fourth pipe 314 in the oxygen removal stage and blocks the fourth pipe 314 in the oxygen detection stage, so that the fourth pipe 314 is not switched on.

Specifically, one end of the fourth pipe 314 is connected to the switching ball valve 32, while the other end thereof is connected to the oxygen removal gas supply device. The oxygen removal gas device can supply an oxygen removal gas to the fourth pipe 314. In the oxygen removal stage, the fourth pipe 314 is communicated with the third pipe 313 through the switching ball valve 32, and the oxygen removal gas flows to the fourth pipe 314, then flows to the oxygen sensor 36 on the third pipe 313 through the switching ball valve 32, and flows to the oxygen removal pipe 2 through the third pipe 313 for discharging. Thus, the oxygen removal gas can be fed into the oxygen sensor 36 through the switching ball valve 32, so that the oxygen sensor 36 is prevented from giving an alarm and aging. Moreover, the fed oxygen removal gas can also discharge the mixed gas entering the third pipe 313.

As shown in FIG. 1, the oxygen sensor 36 may be arranged at an end of the third pipe 313 connected to the switching ball valve 32 and near the switching ball valve 32. In this way, the structure becomes more compact, the length of the oxygen detection pipe 31 can be decreased, the cost can be reduced, and the residual gas in the third pipe 313 can be reduced.

In some embodiments of the present invention, the switching ball valve 32 comprises a switching valve body 321 and a switching valve core 323. Four valve ports are provided on the switching valve body 321. The first pipe 311, the second pipe 312, the third pipe 313 and the fourth pipe 314 are one-to-one connected to the four valve ports, respectively. The switching valve core 323 is rotatably arranged in the switching valve body 321 between a first position and a second position. When the switching valve core 323 is located at the first position, the valve port 315 connected to the first pipe 311 is communicated with the valve port 316 connected to the second pipe 312, and the valve port 317 connected to the third pipe 313 is communicated with the valve port 318 connected to the fourth pipe 314. When the switching valve core 323 is located at the second position, the valve port 315 connected to the first pipe 311 is communicated with the valve port 317 connected to the third pipe 313. Therefore, in the oxygen removal stage, the switching valve core 323 is rotated to the first position, so that the first pipe 311 is communicated with the second pipe 312 and the third pipe 313 is communicated with the fourth pipe 314. In the oxygen detection stage, the switching device is rotated to the second position, so that the first pipe 311 is communicated with the third pipe 313. At this time, for the second pipe 312 and the fourth pipe 314, the second pipe 312 can be communicated with the fourth pipe 314 to allow the oxygen removal gas to flow to the oxygen removal pipe 2 through the fourth pipe 314 and the second pipe 312. Preferably, the second pipe 312 is not communicated with the fourth pipe 314, that is, the switching valve core 323 can block the valve port 316 connected to the second pipe 312 and the valve port 318 connected to the fourth pipe 314, so that the waste of the oxygen removal gas is reduced.

Specifically, as shown in FIGS. 2-5, a spherical valve chamber 322 can be defined in the switching valve body 321, the switching valve core 323 is rotatably arranged in the spherical valve chamber 322, and the fourth valve ports are distributed on the switching valve body 321 at uniform intervals. Further, on a cross-section of the switching valve body 321 passing through the center of sphere, the four valve ports can be distributed in the axial direction of the cross-section at uniform intervals. In this way, by rotating the switching valve core 323, the four valve ports can be switched on as required in different stages according to different conditions.

Figure 2:
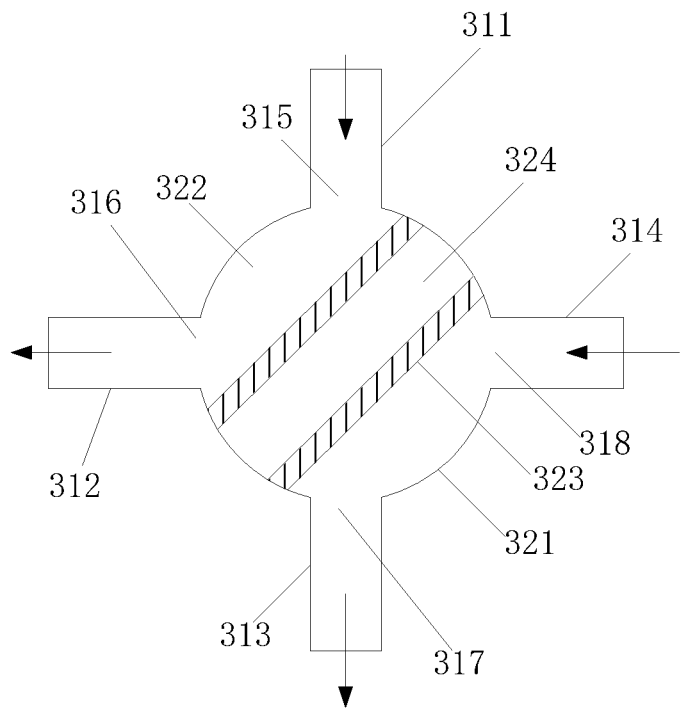
FIG. 2 is a schematic structure diagram of a switching ball valve when a switching valve core of the semiconductor device is located at a first position according to an embodiment of the present invention.
Figure 3:
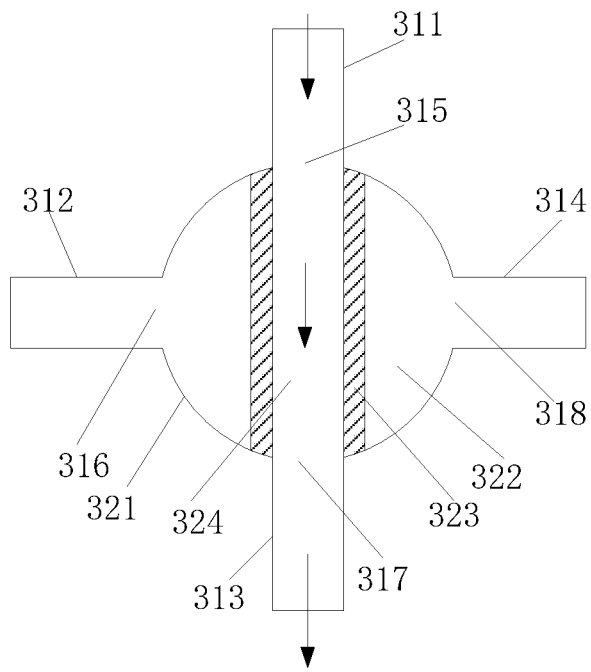
FIG. 3 is a schematic structure diagram of the switching ball valve when the switching valve core of the semiconductor device is located at a second position according to an embodiment of the present invention.

Optionally, as shown in FIGS. 2 and 3, a first passage 324 may be provided in the switching valve core 323. Specifically, the first passage 324 is formed in the switching valve core 323 and runs through the switching valve core 323 in a radial direction of the switching valve core 323. In FIG. 2, when the switching valve core 323 is located at the first position, the first passage 324 is blocked by the sidewall of the switching valve core 323. At this time, adjacent valve ports are communicated, that is, the valve port 315 connected to the first pipe 311 is communicated with the valve port 316 connected to the second pipe 312, and the valve port 317 connected to the third pipe 313 is communicated with the valve port 318 connected to the fourth pipe 314. In FIG. 3, when the switching valve core 323 is located at the second position, the switching valve core 323 is rotated to between the valve port 315 connected to the first pipe 311 and the valve port 317 connected to the third pipe 313, and two ends of the first passage 324 are communicated with the valve port 315 connected to the first pipe 311 and the valve port 317 connected to the third pipe 313, respectively, so that the first pipe 311 is communicated with the second pipe 312. Meanwhile, the valve port 323 can block the valve port 316 connected to the second pipe 312 and the valve port 318 connected to the fourth pipe 314, so that the second pipe 312 is not communicated with the fourth pipe 314. In the examples shown in FIGS. 2 and 3, a dual-plate structure can be formed in the switching valve core 323, and only the first passage 324 is formed on the switching valve core 323.

Figure 4:
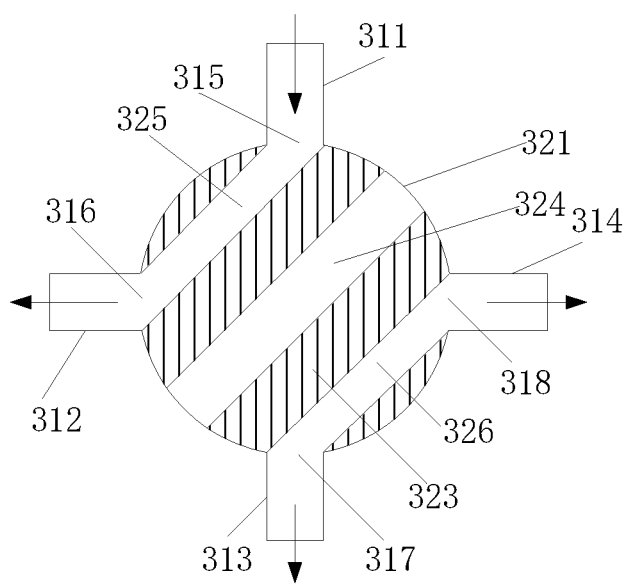
FIG. 4 is a schematic structure diagram of the switching ball valve when the switching valve core of the semiconductor device is located at a first position according to another embodiment of the present invention.
Figure 5:
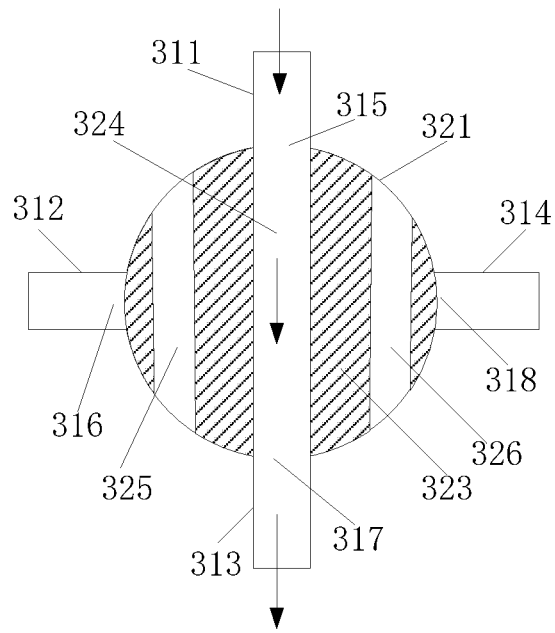
FIG. 5 is a schematic structure diagram of the switching ball valve when the switching valve core of the semiconductor device is located at a second position according to another embodiment of the present invention.

In other examples of the present invention, as shown in FIGS. 4 and 5, a second passage 325 and a third passage 326 are further provided in the switching valve core 323. In FIG. 4, when the switching valve core 323 is located at the first position, the second passage 325 communicates the valve port 315 connected to the first pipe 311 with the valve port 316 connected to the second pipe 312, and the third passage 326 communicates the valve port 317 connected to the third pipe 313 with the valve port 318 connected to the fourth pipe 314. That is, a first passage 324, a second passage 325 and a third passage 326 can be formed in the switching valve core 323. When the switching valve core 323 is located at the first position, two ends of the first passage 324 are blocked by the sidewall of the switching valve body 321, the second passage 325 communicates the valve port 315 connected to the first pipe 311 with the valve port 316 connected to the second pipe 312, and the third passage 326 communicates the valve port 317 connected to the third pipe 313 with the valve port 318 connected to the fourth pipe 314. In FIG. 5, when the switching valve core 323 is located at the second position, a sidewall of the switching valve core 323 on the second passage side blocks the second pipe 312, and a sidewall of the switching valve core 323 on the third passage side blocks the fourth pipe 314. In this way, the valve port 315 connected to the first pipe 311 is communicated with the valve port 317 connected to the third pipe 313 through the first passage 324, two ends of each of the second passage 325 and the third passage 326 are blocked by the sidewall of the switching valve core 323, and the valve port 316 connected to the second pipe 312 and the valve port 318 connected to the fourth pipe 314 are blocked by the switching valve core 323 and cannot be communicated. The switching valve core 323 may be formed in a spherical shape matched with the switching valve body 321, so that it is convenient to form the first passage 324, the second passage 325 and the third passage 326 in the switching valve core 323.

Optionally, the switching ball valve 32 may further comprise a valve shaft and a driving device. The valve shaft is connected to the switching valve core 323, and the driving device drives the valve shaft to drive the switching valve body 321 to move. Specifically, the driving device is arranged outside the switching valve body 321, and the driving device is connected to the switching valve body 321 through the valve shaft. In this way, the driving device can drive the switching valve body 321 to move by driving the valve shaft to rotate, so as to provide a power source for the movement of the switching valve body 321. The structure is simple and not controlled manually. Of course, it should be understood that no driving device may be provided in the switching ball valve 32 and the movement of the switching valve body 321 between the first position and the second position is realized by manually rotating the valve shaft.

For the inner diameter of the switching valve body 321 and the inner diameter of the oxygen detection pipe 31, the maximum inner diameter of the switching valve body 321 may be 1.5 to 3 times of that of the oxygen detection pipe 31. Preferably, the maximum inner diameter of the switching valve body 321 may be 2 times of that of the oxygen detection pipe 31, so that it is advantageous for the connection between the switching ball valve 32 and the oxygen detection pipe 31 and the circulation of the gas. Further, the first pipe 311, the second pipe 312, the third pipe 313 and the fourth pipe 314 may be the same in inner diameter, the switching valve body 321 is formed in a spherical shape, and the inner diameter of the switching valve body 321 is 1.5 to 3 times of that of the oxygen detection pipe 31.

For the material of the switching ball valve 32, the switching valve core 323 and the switching valve body 321 may be made of a corrosion resistant material. Thus, the corrosion to the switching valve core 323 and the switching valve body 321 by the flowing gas can be reduced, the service life of the switching ball valve 32 can be prolonged, the service life of the semiconductor device 110 can thus be prolonged, and the maintenance cost can be reduced.

In some embodiments of the present invention, as shown in FIG. 1, the semiconductor device 100 may further comprise a first control valve 33 arranged on the first pipe 311, a second control valve 34 arranged on the second pipe 312 and a fourth control valve 35 arranged on the fourth pipe 314. Therefore, the on or off the first pipe 311 can be controlled by the first control valve 33, the on or off of the second pipe 312 can be controlled by the second control valve 34, and the on or off of the third pipe 313 can be controlled by the fourth control valve 35. For example, in the initial stage of oxygen removal, the first control valve 33, the second control valve 34 and the fourth control valve 35 can be turned off. In this way, the oxygen removal gas can directly discharge, from the oxygen removal passage, the gas with a high oxygen concentration in the process cavity 1 and the mixed gas of this gas and the oxygen removal gas, so that the efficiency is high, the waste of the oxygen removal gas can be reduced, and the gas in the oxygen detection pipe 31 can be prevented from flowing to the oxygen sensor 36. In the final stage of oxygen removal, before the oxygen detection stage, the first control valve 33, the second control valve 34 and the fourth control valve 35 can be turned on. In this way, the first pipe 311, the second pipe 312, the third pipe 313 and the fourth pipe 314 are communicated through the switching ball valve 32, and the gas can circulate among the first pipe 311, the second pipe 312, the third pipe 313 and the fourth pipe 314.

Optionally, as shown in FIG. 1, the first control valve 33, the second control valve 34 and the fourth control valve 35 are all arranged near the switching ball valve 32. The first control valve 33, the second control valve 34 and the fourth control valve 35 are all check valves. In this way, the gas in the pipes can be prevented from flowing back. For example, when the first pipe 311 is communicated with the second pipe 312, by the first control valve 33 and the second control valve 34, the gas in the oxygen removal pipe 2 is only allowed to flow from the first pipe 311 to the second pipe 312 and then to the oxygen removal pipe 2 to discharge the gas with a high oxygen concentration residual in the first pipe 311 and the second pipe 312, so that the gas is prevented from flowing back to the second pipe 312 and the first pipe 311. Moreover, the fourth control valve 35 is arranged on the fourth pipe 314, so that the gas can be prevented from flowing back to pollute the oxygen removal gas.

The present invention further provides an oxygen removal method for a semiconductor device.

The oxygen removal method for a semiconductor device according to an embodiment of the present invention will be described below with reference to the accompanying drawings. The oxygen removal method is applicable to the semiconductor device 100 in the above-described embodiments.

As shown in FIG. 1, the semiconductor device may comprise a process cavity 1, an oxygen removal pipe 2 and an oxygen detection device 3. The process cavity 1 has an oxygen removal inlet 12 and an oxygen removal outlet 13. The process cavity 1 is a reaction chamber for high-temperature thermal treatment of a semiconductor. The high-temperature thermal treatment is carried out in the process cavity 1 and has very high requirements for the oxygen concentration in the process cavity 1. In order to satisfy the requirements of the manufacturing process for the oxygen concentration, a large amount of an oxygen removal gas (e.g., nitrogen) is fed before high-temperature manufacturing to remove oxygen in the process chamber 11, so that the oxygen concentration satisfies the standard.

The oxygen detection device 3 is configured to detect the oxygen concentration. For example, after oxygen removal is performed for a period of time, the oxygen detection device 3 starts to operate, the gas in the process chamber 11 flows to the oxygen detection device 3 through the oxygen removal pipe 2, and the oxygen detection device 3 detects the oxygen concentration of the gas to determine whether the oxygen concentration in the process chamber 11 satisfies the requirements.

The oxygen detection device 3 may comprise an oxygen detection pipe 31, a switching ball valve 32 and an oxygen sensor 36. The oxygen detection pipe 31 comprises a first pipe 311, a second pipe 312 and a third pipe 313, which are arranged in parallel and all connected to the oxygen removal pipe 2 and the switching ball valve 32. The oxygen sensor 36 is arranged on the third pipe 313 to detect the oxygen concentration. The switching ball valve 32 is connected to the first pipe 311, the second pipe 312 and the third pipe 313, respectively, to control the on or off of the first pipe 311, the second pipe 312 and the third pipe 313.

In a gas flow direction of the oxygen removal pipe 2, the first pipe 311, the second pipe 312 and the third pipe 313 are successively communicated with the oxygen removal pipe 2. As shown in FIG. 1, the connection port between the oxygen removal pipe 2 and the first pipe 311 is located upstream of the connection port between the oxygen removal pipe 2 and the second pipe 312, and the connection port between the oxygen removal pipe 2 and the second pipe 312 is located upstream of the connection port between the oxygen removal pipe 2 and the third pipe 313. The gas in the oxygen removal pipe 2 successively flows through the port between the oxygen removal pipe 2 and the first pipe 311, the port between the oxygen removal pipe 2 and the second pipe 312 and the port between the oxygen removal pipe 2 and the second pipe 312.

The switching ball valve 32 is constructed in such a way: in an oxygen removal stage, the switching ball valve 32 communicates the first pipe 311 with the second pipe 312 and blocks the third pipe 313; and, in an oxygen detection stage, the switching ball valve 32 communicates the first pipe 311 with the third pipe 313, so that the third pipe 313 is communicated with the oxygen removal pipe 2, and the gas can flow to the oxygen removal pipe 2 for discharging. Thus, the oxygen concentration in the process cavity 1 can be accurately detected, and the machine can be prevented from giving an alarm due to a too high oxygen concentration.

Figure 6:
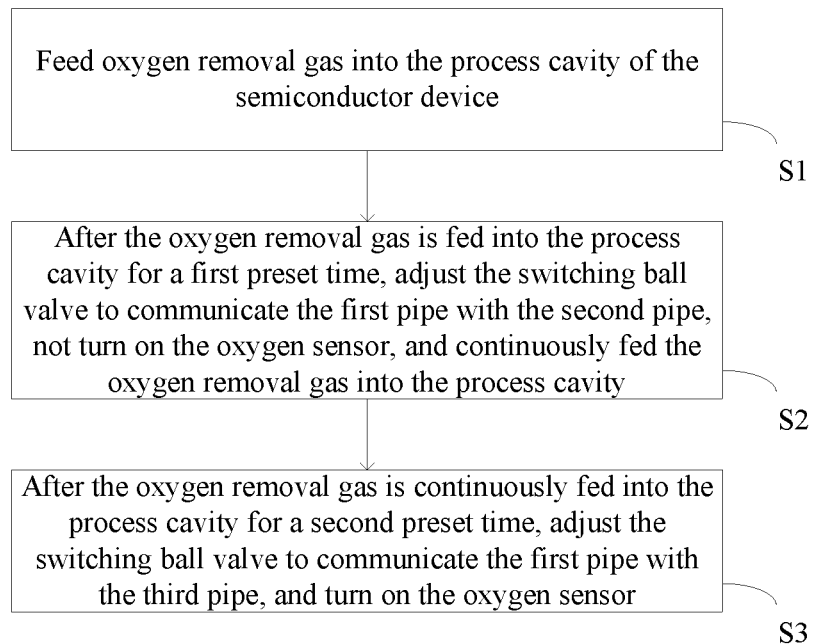
FIG. 6 is a flowchart of an oxygen removal method for a semiconductor device according to an embodiment of the present invention.

As shown in FIG. 6, the oxygen removal method comprises the following steps. S1: The oxygen removal gas is fed into the process cavity 1 of the semiconductor device 100. In this way, in the initial stage of oxygen removal, a high concentration of oxygen in the process cavity 1 can be removed by feeding the oxygen removal gas into the process cavity 1. For the oxygen removal gas, the oxygen removal gas may be nitrogen.

S2: After the oxygen removal gas is fed into the process cavity 1 for a first preset time, the switching ball valve 32 is adjusted to communicate the first pipe 311 with the second pipe 312, the oxygen sensor 36 is not turned on, and the oxygen removal gas is continuously fed into the process cavity 1. S3: After the oxygen removal gas is continuously fed into the process cavity 1 for a second preset time, the switching ball valve 32 is adjusted to communicate with the first pipe 311 with the third pipe 313, and the oxygen sensor 36 is turned on.

Specifically, in the initial stage of oxygen removal, the oxygen removal gas is fed into the process cavity 1 to remove oxygen in the process cavity 1, and the gas feeding time can be timed. After the oxygen removal gas is fed into the process cavity 1 for a first preset time, the oxygen content in the process cavity 1 is reduced. In order to satisfy the requirements of the manufacturing process for the oxygen concentration, it is required to detect whether the oxygen concentration in the process cavity 1 satisfies the requirements. Since the mixed gas with a high oxygen concentration partially enters the oxygen detection pipe 31 in the initial stage of oxygen removal, in order to ensure the accuracy of oxygen detection, it is required to discharge a high concentration of oxygen in the pipe upstream of the oxygen sensor 36 for detection. Thus, the oxygen sensor 36 is turned off, the oxygen removal gas is continuously fed into the process cavity 1, and the first pipe 311 is communicated with the third pipe 313 by adjusting the switching ball valve 32. In this way, the gas with a high oxygen concentration in the first pipe 311 flows to the oxygen removal pipe 2 through the switching ball valve 32 and the second pipe 312, so that the gas with a high oxygen concentration in the first pipe 311 can be discharged. Meanwhile, since the gas with a high oxygen concentration does not flow through the oxygen sensor 36, the oxygen sensor 36 can be prevented from giving an alarm in the initial stage due to a high oxygen concentration, and can also be prevented from contacting with the high oxygen concentration for a long time to quicken the aging the oxygen sensor 36.

After the oxygen removal gas is continuously fed for a second preset time, the gas with a high oxygen concentration in the first pipe 311 is discharged. At this time, the gas in the first pipe 311 is the same as the gas in the process cavity 1, and the switching ball valve 32 is adjusted to communicate the first pipe 311 with the third pipe 313 and block the second pipe 312. In this way, the gas in the process cavity 1 flows to the third pipe 313 through the first pipe 311 and then flows through the oxygen sensor 36. The oxygen concentration of the flowing gas is detected by the oxygen sensor 36 to detect whether the oxygen concentration in the process cavity 1 satisfies the requirements. It is to be noted that, the second preset time may be timed from the time when the oxygen removal gas is fed in the initial stage of oxygen removal, or may also be timed from the time when the switching ball valve 32 is adjusted to communicate the first pipe 311 with the second pipe 312. The setting and timing mode of the second preset time may be set according to the actual situation, and will not be specifically limited in the present invention.

Therefore, the oxygen removal method for a semiconductor device according to the embodiment of the present invention can improve the accuracy of oxygen detection, can prevent the machine from giving an alarm due to inaccurate oxygen concentration detection, and can reduce the device aging due to long-time contact with the gas with a high oxygen concentration.

Optionally, the oxygen detection pipe 31 further comprises a fourth pipe 314 communicated with the switching ball valve 32 and an oxygen removal gas supply device; the step of adjusting the switching ball valve 32 to communicate the first pipe 311 with the second pipe 312 comprises: adjusting the switching ball valve 32 to communicate the first pipe 311 with the second pipe 312 and communicate the third pipe 313 with the fourth pipe 314; and, the step of adjusting the switching ball valve 32 to communicate the first pipe 311 with the third pipe 313 comprises: communicating the first pipe 311 with the third pipe 313, and blocking the second pipe 312 and the fourth pipe 314. Thus, in the oxygen removal stage, the gas with a high oxygen concentration in the first pipe 311 is discharged through the second pipe 312, and the oxygen removal gas is fed into the third pipe 313 and the oxygen sensor 36 through the fourth pipe 314. In the oxygen detection stage, the gas in the process cavity 1 flows to the third pipe 313 through the first pipe 311, the oxygen sensor 36 detects the flowing gas to determine whether the oxygen concentration of the gas in the process cavity 1 satisfies the requirements, and the second pipe 312 and the fourth pipe 314 are turned off.

Further, the semiconductor device 100 further comprises a first control valve 33 arranged on the first pipe 311, a second control valve 34 arranged on the second pipe 312 and a fourth control valve 35 arranged on the fourth pipe 314. After adjusting the switching ball valve 32 to communicate the first pipe 311 with the second pipe 312, the oxygen removal method further comprises the fooling step: turning on the first control valve, the second control valve and the fourth control valve. Before adjusting the switching ball valve 32 to communicate the first pipe 311 with the third pipe 313, the oxygen removal method further comprises the following step: turning on the first control valve 33 and turning off the second control valve 34 and the fourth control valve 35. In this way, the on or off the first pipe 311, the second pipe 312 and the fourth pipe 314 can be controlled by the first control valve 33, the second control valve 34 and the fourth control valve 35. The structure is simple, and it is easy to control.

Further, before adjusting the switching ball valve 32 to communicate the first pipe 311 with the second pipe 312 and communicate the third pipe 313 with the fourth pipe 314 and turning on the oxygen sensor 36, the oxygen removal method further comprises the following step: feeding the oxygen removal gas into the fourth pipe 314 by the oxygen removal gas supply device. In this way, the oxygen removal gas can flow to the third pipe 313 through the fourth pipe 314 and then flow through the oxygen sensor 36. Thus, by feeding the oxygen removal gas, the oxygen sensor 36 can be further protected, and the gas with a high oxygen concentration residual in the third pipe 313 can be discharged.

The above description is a preferred implementation of the present invention, it should be noted that for a person of ordinary skill in the art, various improvements and modifications may be made without departing from the principle of the present invention, and those improvements and modifications should also be regarded as falling into the protection scope of the present invention.

The invention claimed is:

1. An oxygen removal method for a semiconductor device, wherein the semiconductor device comprises a process chamber, an oxygen removal pipe and an oxygen detection device; the oxygen detection device comprises an oxygen detection pipe, a switching ball valve and an oxygen sensor; the oxygen detection pipe comprises a first pipe, a second pipe and a third pipe which are arranged in parallel and all connected to the oxygen removal pipe and the switching ball valve respectively; the first pipe, the second pipe and the third pipe are successively communicated with the oxygen removal pipe in a gas flow direction of the oxygen removal pipe; the oxygen sensor is arranged on the third pipe; the oxygen removal method comprises:

feeding oxygen removal gas into the process chamber of the semiconductor device;

after the oxygen removal gas is fed into the process chamber for a first preset time, adjusting the switching ball valve to communicate the first pipe with the second pipe, not turning on the oxygen sensor, and continuously feeding the oxygen removal gas into the process chamber; and after the oxygen removal gas is continuously fed into the process chamber for a second preset time, adjusting the switching ball valve to communicate the first pipe with the third pipe, and turning on the oxygen sensor wherein the oxygen detection pipe further comprises a fourth pipe communicated with the switching ball valve and an oxygen removal gas supply device, and the adjusting the switching ball valve to communicate the first pipe with the second pipe comprises: adjusting the switching ball valve to communicate the first pipe with the second pipe and communicate the third pipe with the fourth pipe; and the adjusting the switching ball valve to communicate the first pipe with the third pipe comprises: adjusting the switching ball valve to communicate the first pipe with the third pipe and block the second pipe and the fourth pipe; wherein the switching ball valve comprises a switching valve body and a switching valve core; the switching valve body is provided with four valve ports; the switching valve body is rotatably arranged in the switching valve body and between a first position and a second position; the first pipe, the second pipe, the third pipe and the fourth pipe are connected to one of the four valve ports respectively; when the switching valve core is located at the first position, the valve port connected to the first pipe is communicated with the valve port connected to the second pipe, and the valve port connected to the third pipe is communicated with the valve port connected to the fourth pipe; and, when the switching valve core is located at the second position, the valve port connected to the first pipe is communicated with the valve port connected to the third pipe.

2. The oxygen removal method for a semiconductor device according to claim 1, wherein the semiconductor device further comprises a first control valve arranged on the first pipe, a second control valve arranged on the second pipe and a fourth control valve arranged on the fourth pipe; after adjusting the switching ball valve to communicate the first pipe with the second pipe, the oxygen removal method further comprises:
 turning on the first control valve, the second control valve and the fourth control valve; and
 before adjusting the switching ball valve to communicate the first pipe with the third pipe, the oxygen removal method further comprises: turning on the first control valve and turning off the second control valve and the fourth control valve.

3. The oxygen removal method for a semiconductor device according to claim 1, before adjusting the switching ball valve to communicate the first pipe with the second pipe and communicate the third pipe with the fourth pipe and turning on the oxygen sensor, further comprising:
 feeding the oxygen removal gas into the fourth pipe by the oxygen removal gas supply device.

4. The oxygen removal method for a semiconductor device according to claim 1, the oxygen removal gas comprises nitrogen.

5. The oxygen removal method for a semiconductor device according to claim 1, wherein the switching valve core is provided with a first passage; when the switching valve core is located at the second position, the valve port connected to the first pipe is communicated with the valve port connected to the third pipe through the first passage; wherein the switching valve core is provided with a second passage and a third passage; when the switching valve core is located at the first position, the second passage communicates the valve port connected to the first pipe with the valve port connected to the second pipe, and the third passage communicates the valve port connected to the third pipe with the valve port connected to the fourth pipe; when the switching valve core is located at the second position, a sidewall of the switching valve core on the second passage side blocks the second pipe, and a sidewall of the switching valve core on the third passage side blocks the fourth pipe.

6. The oxygen removal method for a semiconductor device according to claim 1, wherein,
 in oxygen removal stage, the flowing gas in the first pipe is discharged through the second pipe, and the oxygen removal gas is fed into the third pipe and the oxygen sensor through the fourth pipe;
 in oxygen detection stage, a flowing gas in the process chamber flows to the third pipe through the first pipe, the oxygen sensor detects the flowing gas to determine whether an oxygen concentration of the flowing gas in the process chamber satisfies requirements, and the second pipe and the fourth pipe are turned off.

7. A semiconductor device configured to perform the oxygen removal method according to claim 1, comprising:
 the process cavity chamber, having the oxygen removal inlet and
 the oxygen removal outlet;
 the oxygen removal pipe, connected to the oxygen removal outlet and an exhaust device respectively; and
 the oxygen detection device, comprising the oxygen detection pipe, the switching ball valve and the oxygen sensor, the oxygen detection pipe comprising the first pipe, the second pipe and the third pipe which are arranged in parallel and all connected to the oxygen removal pipe and the switching ball valve, the first pipe, the second pipe and the third pipe being successively communicated with the oxygen removal pipe in the gas flow direction of the oxygen removal pipe, the oxygen sensor being arranged on the third pipe, the switching ball valve being constructed in such a way that the switching ball valve communicates the first pipe with the second pipe in an oxygen removal stage and communicates the first pipe with the third pipe in an oxygen detection stage.

8. The semiconductor device according to claim 7, wherein the oxygen detection pipe further comprises a fourth pipe, the fourth pipe is connected to the switching ball valve and an oxygen removal gas supply device respectively; and, the switching ball valve is constructed in such a way that the switching ball valve communicates the third pipe with the fourth pipe in the oxygen removal stage and blocks the fourth pipe in the oxygen detection stage.

9. The semiconductor device according to claim 8, wherein the switching ball valve comprises a switching valve body and a switching valve core; the switching valve body is provided with four valve ports; the switching valve body is rotatably arranged in the switching valve body and between a first position and a second position; the first pipe, the second pipe, the third pipe and the fourth pipe are connected to one of the four valve ports respectively; when the switching valve core is located at the first position, the valve port connected to the first pipe is communicated with the valve port connected to the second pipe, and the valve port connected to the third pipe is communicated with the valve port connected to the fourth pipe; and, when the switching valve core is located at the second position, the valve port connected to the first pipe is communicated with the valve port connected to the third pipe.

10. The semiconductor device according to claim 9, wherein the switching valve core is provided with a first passage; when the switching valve core is located at the second position, the valve port connected to the first pipe is communicated with the valve port connected to the third pipe through the first passage.

11. The semiconductor device according to claim 10, wherein the switching valve core is provided with a second passage and a third passage; when the switching valve core is located at the first position, the second passage communicates the valve port connected to the first pipe with the valve port connected to the second pipe, and the third passage communicates the valve port connected to the third pipe with the valve port connected to the fourth pipe; when the switching valve core is located at the second position, a sidewall of the switching valve core on the second passage side blocks the second pipe, and a sidewall of the switching valve core on the third passage side blocks the fourth pipe.

12. The semiconductor device according to claim 9, wherein a maximum inner diameter of the switching valve body is 1.5 to 3 times of a maximum inner diameter of the oxygen detection pipe.

13. The semiconductor device according to claim 9, wherein the switching ball valve further comprises a valve shaft and a driving device; the valve shaft is connected to the switching valve core; the driving device drives the valve shaft to drive the switching valve body to move.

14. The semiconductor device according to claim 9, wherein both the switching valve core and the switching valve body are made of a corrosion resistant material.

15. The semiconductor device according to claim 8, further comprising a first control valve arranged on the first pipe, a second control valve arranged on the second pipe and a fourth control valve arranged on the fourth pipe.

16. The semiconductor device according to claim 15, wherein the first control valve, the second control valve and the fourth control valve are all check valves.

17. The semiconductor device according to claim 15, wherein the first control valve, the second control valve and the fourth control valve are all arranged near the switching ball valve.

18. The semiconductor device according to claim 7, wherein the oxygen sensor is arranged at an end of the third pipe connected to the switching ball valve and near the switching ball valve.

* * * * *